United States Patent [19]
Tonai et al.

[11] Patent Number: 5,345,074
[45] Date of Patent: Sep. 6, 1994

[54] SEMICONDUCTOR LIGHT SOURCE

[75] Inventors: Ichiro Tonai; Yoshiki Kuhara, both of Osaka, Japan

[73] Assignee: Sumitomo Electric Industries, Ltd., Osaka, Japan

[21] Appl. No.: 35,215

[22] Filed: Mar. 22, 1993

Related U.S. Application Data

[63] Continuation-in-part of Ser. No. 787,954, Nov. 5, 1991, Pat. No. 5,214,276.

[30] Foreign Application Priority Data

Nov. 13, 1990 [JP] Japan ................................ 2-308094

[51] Int. Cl.⁵ ............................................. H01J 40/14
[52] U.S. Cl. ................................... 250/214.1; 250/205
[58] Field of Search ................... 250/214.1, 551, 216, 250/227.11, 205; 257/431, 435

[56] References Cited

U.S. PATENT DOCUMENTS 4,864,119  9/1989  Ragle et al. ...................... 250/214.1

Primary Examiner—David C. Nelms
Attorney, Agent, or Firm—Cushman, Darby & Cushman

[57] ABSTRACT

A semiconductor light source for transmitting light signals of digital or analog data having a laser diode and a photodiode for monitoring the output power of the laser diode. The driving current of the laser diode is adjusted by the photocurrent of the monitoring photodiode. The photodiode has a light receiving region at a center enclosed by an annular electrode and a light non-receiving region outside the annular electrode. If leak light beams entered the non-receiving region, delayed photocurrent is produced. The delayed photocurrent misleads the control of the laser diode. This invention provides a non-receiving region of the photodiode with a dielectric layer for reflecting or absorbing light beams in order to preventing the light beams from producing the delayed photocurrent.

18 Claims, 3 Drawing Sheets

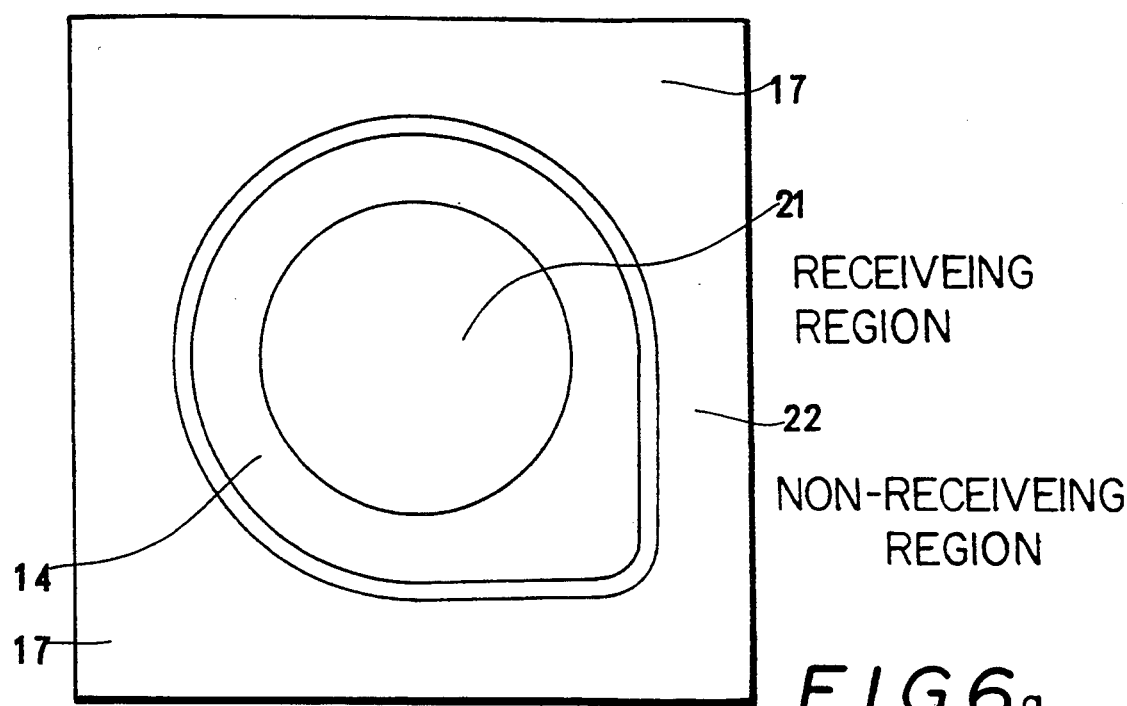
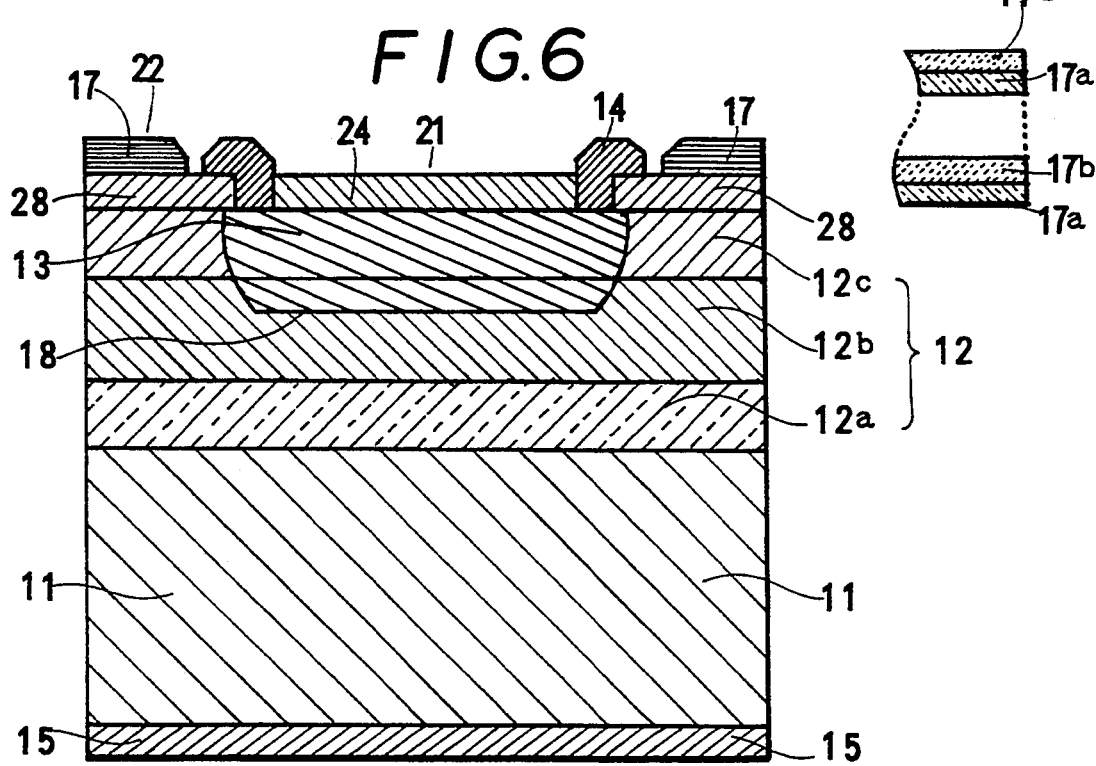

SEMICONDUCTOR LIGHT SOURCE

This is a continuation-in-part of application Ser. No. 07/787,954, which was filed Nov. 5, 1991, and is now issued as U.S. Pat. No. 5,214,276.

FIELD OF THE INVENTION

This invention relates to a semiconductor light source utilized for a transmitter of optoelectronic communication system.

BACKGROUND OF THE INVENTION

Optical communication system transmits information from a transmitter having a light source to a receiver having a photodetector via an optical fiber. A semiconductor light source comprises a semiconductor laser diode chip (1), a photodiode chip (2), a header (3) on which the laser diode chip (1) and the photodiode chip (2) are mounted, leads (4) fixed to the header (3), a cap (5) with a window fitted on the header (3), and a spherical lens (6) fixed to the window of the cap (5). The laser diode chip (1) emits modulated light beams bearing signals. The photodiode chip (2) monitors the output power of the laser diode by detecting backward light emitted from the laser diode chip (1). The lens (6) converges the light beams from the laser diode chip (1) on a core of an optical fiber (9) with high efficiency. The leads (4) are connected to both electrodes of the laser diode chip (1) and the monitoring photodiode chip (2) for introducing a driving current onto the laser diode chip (1) and for extracting a photocurrent from the monitoring photodiode chip (2). The cap (5) has another object of sealing an inner space airtightly besides of supporting the lens (6).

The output power of a semiconductor laser diode is varied owing to functional degeneration and change of the atmospheric temperature, even if the driving current is kept to be constant.

Therefore, the monitoring photodiode chip (2) is installed behind the laser diode chip (1). The laser diode chip (1) emits light beams both to a front side (7) and a rear side (8). The front beams are converged on the optical fiber (9) to transmit information signals. The rear beams enter the photodiode chip (2) which monitors the output power of the laser diode chip (1). Since the ratio of the front beams to the rear beams is constant, irrespective of the fluctuation of the output power of the laser diode, the photocurrent of the photodiode is proportional to the front light beams bearing information signals. Therefore, if the driving current of the laser diode is controlled so as to keep the photocurrent of the monitoring photodiode to be constant, the front beams of the laser diode can be maintained to be constant.

However, current digital optoelectronic communication transmits digital signals by representing "0" and "1" by changing the output of the laser diode in square waves. An increase of sending information per second raises the frequency of the change of the light intensity emitted from the laser diode (1). For example, when one billion bit / sec ($10^9$bit/sec) of information signals are transmitted, the length of a bit signal is shorter than 1 us (nanoseconds). Such high speed transmission will incur the difficulty of deformation of square pulses. In the case, the rising time or falling time of a pulse becomes the focus of attention.

The case where the response time is as short as the order of 1 ns will be considered now. The light intensity emitted from the laser diode changes in one ns. The photocurrent of the monitoring photodiode must change in accordance with the rapid change of the light intensity. If the delay of the function of the monitoring photodiode were left untouched, the following malfunctions would occur.

Owing to the delay of response of the photodiode, the rising of a square pulse would be sometimes delayed and the falling of a square pulse would also be delayed to the change of the light intensity. At the earliest stage of a light pulse, no photocurrent would flow in the photodiode, although the light enters the photodiode. At the moment, the feedback circuit would make an erroneous judgement that no light would now be emitted from the laser diode, and would increase the driving current for the laser diode, because the photodiode did not seem to feel light beams entering therein. The erroneous increase of the driving current of the laser diode would lead to surplus of the light intensity beyond the allowed scope. On the contrary, at the final stage of a pulse, some photocurrent would still flow in the photodiode owing to the delay of the photocurrent generation, although light emission of the laser diode has already been ended. The feedback circuit would again misunderstand the state of the light emission and would reduce the driving current below the pertinent level, since it still receives a photocurrent from the monitoring photodiode. In such a case, a reverse current may flow in the laser diode, depending on the structure of the electronic circuits. The excess current at the early stage and the reverse current at the final stage of a pulse may injure or destruct the laser diode. Such malfunctions result from the delay of the monitoring photodiode.

Suppression of the delay of the monitoring photodiode will solve the difficulty of malfunctions of the driving circuit. The reason why the delay of the photodiode chip is induced is now briefly explained. A conventional photodiode chip (2) has a semiconductor substrate (11), epitaxial layers (12) deposited on the substrate (11), a diffusion region (13) produced at the center of the epitaxial layers (12), an annular electrode (14) formed on the diffusion region, and a planar electrode (15) formed on the bottom side of the substrate (11). If the substrate is n-type, the diffusion region is p-type. If the substrate is p-type, the diffusion region is n-type. The substrate (11) and the diffusion region (13) have reciprocal conduction properties. A dish-like boundary between the diffusion region (13) and the epitaxial layers (12) is a pn-junction (18). The central part enclosed by the annular electrode (14) is now called a receiving region for light. Light beams (16) which enter the receiving region will generate rapid photocurrents owing to the strong electric fields acting on the region. The strong electric fields carry electrons and holes excited by the light beams with high velocities to the electrodes.

The peripheral part outside the pn-junction (18) is now called a non-receiving region. If the light beams (20) entered the non-receiving region, slow photocurrents would be induced, because weak electric fields would drag the electrons and the holes slowly into the electrodes. These slow flows of carriers in the non-receiving region cause the delay of the photodiode. Thus, elimination of the light entering the non-receiving region will prevent the photodiode function from delaying.

In order to avoid the delay of the monitoring photodiode, a prior light source has strictly determined the position of the monitoring photodiode (2) so as to forbid light beams entering the non-receiving region. The position of the laser diode (1) must also be strictly determined in order to prevent the rear light beams from entering the non-receiving region of the photodiode (2).

Another prior light source employs the feedback circuit which controls the average of the light intensity of the laser to suppress the delay of the photodiode monitoring signals. In this case, the photocurrent of the photodiode is averaged by using, e.g. a capacitor. Since the driving currents are determined on the basis of the averaged photocurrents, the delay of the photodiode response becomes insignificant. The delayed parts are cancelled by taking an average.

However, such an average photocurrent method would suffer from another difficulty. Transmitting signals have various kinds of sequences of levels "0" and "1" in digital communication. Sometimes only level "0" continues, other times only level "1" continues. Otherwise, levels "1" and "0" repeat in turn many times. Therefore, the averages of light intensity would vary to a great extent according to the behavior of the sequences of levels.

For example, a simplified case wherein the level "0" is designated by 0 mW of light power and the level "1" is designated by 1 mW of light power is now assumed to clarify the difficulty. When only the low level "0" continues in the signal, the average of light power becomes 0 mW. When the high level "1" continues alone, the average of light power becomes 1 mW. When both levels "0" and "1" repeat in turn with the same probability, the average of light power is 0.5 mW. The driving circuit has adjusted to supply currents to the laser diode for ensuring average light power of 0.5 mW. If only the low level "0" continues, the diving circuit will supply surplus current for keeping the average light power to be 0.5 mW. But in this case, the light power must maintain 0 mW, because the signals are a sequence of "0"s. On the contrary, if the high level "1" continues alone, the driving circuit will send insufficient currents for keeping the average light power to be 0.5 mW. In this case, the light power must hold 1 mW, because the signals are a sequence of "1"s. The method of the average power control is suitable for the reciprocating sequence of "0" and "1" of signals ( mark rate is 0.5 ) but is erroneous for long sequences of only "0"s or only "1"s.

A prior method of the average power control has made efforts to maintain the mark ratio to be about 0.5 at all times by giving digital signals a scramble or eliminating the time of no signal transmission to avoid malfunctions.

However, a recent tendency of optoelectronic communication requires such a flexible system that can deal with the time change of information quantity. The average power control cannot satisfy the requirement. The main stream of the communication system is turning from the average power control to a peak-holding type which can control individual pulse power. The tendency also demands a monitoring photodiode which is suitable for the peak-holding type control.

Semiconductor light sources are indispensable for optoelectronic communication. But the difficulty and high price of current light sources impede wide prevalence of the optoelectronic communication. One purpose of this invention is to provide a semiconductor light source which can be assembled without difficult adjustment of positions of laser diode and the photodiode. Another purpose of this invention is to provide a semiconductor light source which is suitable for the peak-holding control. The other purpose of this invention is to provide a semiconductor light source which will contribute rapid pervasion of optoelectronic communication systems by supplying inexpensive light sources.

SUMMARY OF THE INVENTION

A semiconductor light source of this invention comprises a semiconductor laser diode chip emitting light beams to a front side and a rear side, a photodiode with a receiving region and a non-receiving region divided by a pn-junction for monitoring the intensity of light beams emitted from the rear side of the laser diode, a header for supporting the laser diode and the photodiode, leads for supplying driving currents to the laser diode and for deducing photocurrents from the photodiode, a cap with an window for sealing the semiconductor laser chips, a lens for converging the light beams emitted to the front side from the laser diode on a core of an optical fiber, wherein the photodiode has a dielectric layer on the non-receiving region for reflecting or absorbing light beams.

BRIEF DESCRIPTION OF THE DRAWINGS

FIG. 5 is a plan view of another example of a photodiode used in the semiconductor light source of this invention.

FIG. 6 and 6a is a sectional view of the same photodiode shown in FIG. 5.

DETAILED DESCRIPTION OF THE PREFERRED EMBODIMENTS

Figure 1:
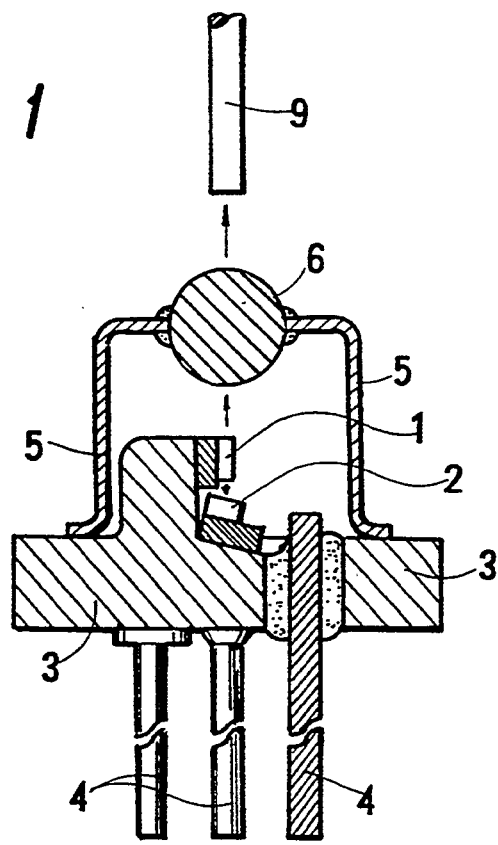
FIG. 1 is a sectional view of a semiconductor light source as an embodiment of invention.
Figure 2:
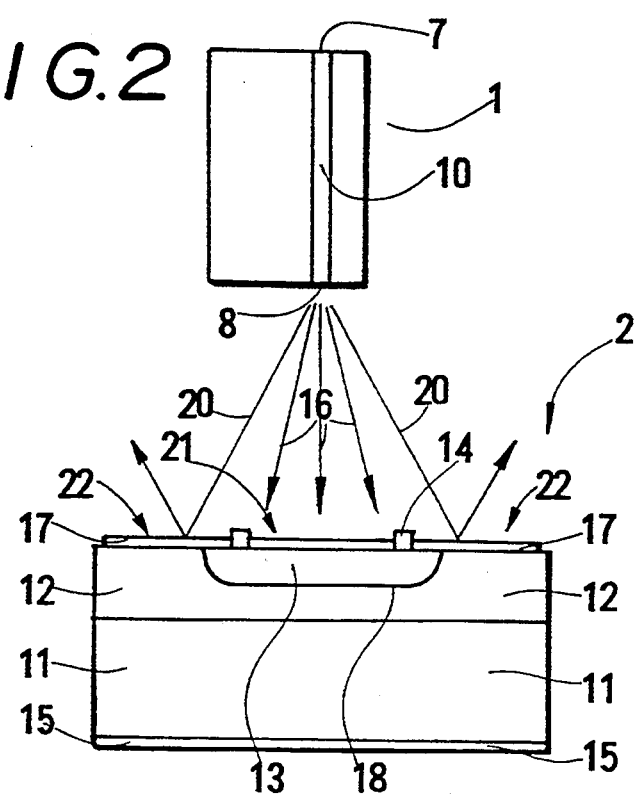
FIG. 2 is an enlarged view of a laser diode and a photodiode shown in FIG. 1.
Figure 3:
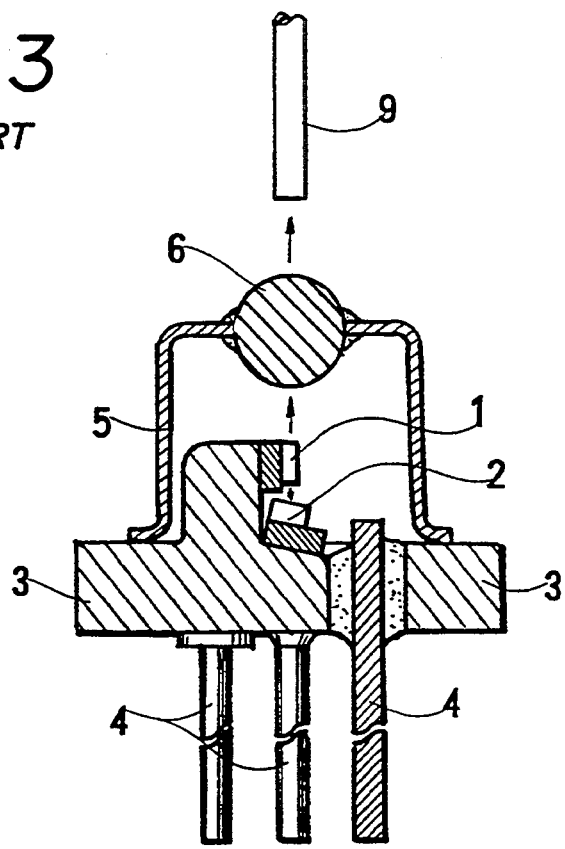
FIG. 3 is a sectional view of a prior semiconductor light source.
Figure 4:
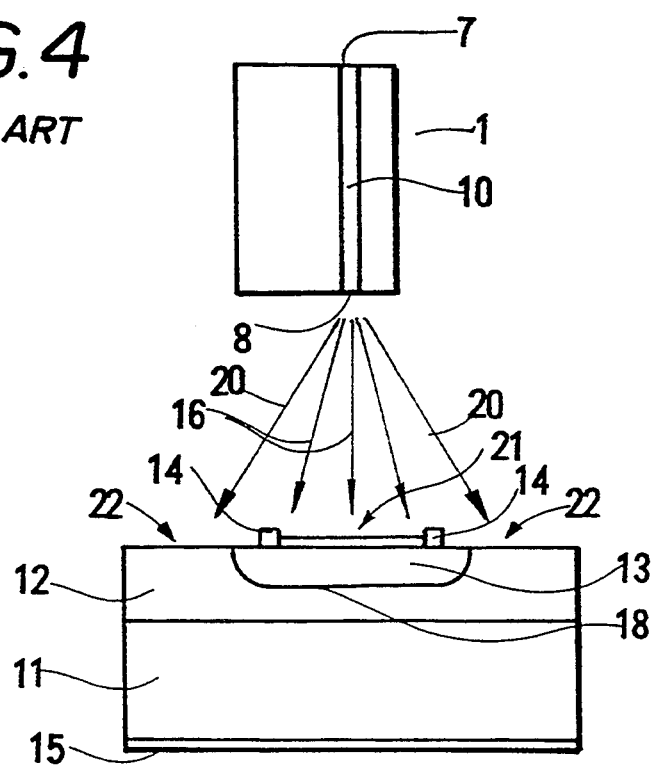
FIG. 4 is an enlarged view of a laser diode and a photodiode shown in FIG. 3.

FIG. 1 shows a section of a light source of this invention. This is similar to FIG. 3 of prior one. FIG. 2 shows an enlarged view of the parts featuring this invention. What is different from prior one is that a photodiode having a dielectric layer covering a non-receiving region of the photodiode for reflecting or absorbing light beams reaching there. Light beams cannot enter the non-receiving region. No pairs of electrons and holes are yielded. No slower photocurrent flows in the monitoring photodiode. The output signals of the photodiode are now fully immune from delayed portions. The monitoring photodiode can exactly accompany the change of the light power emitted from the laser diode without delay. The elimination of delay from the photodiode alleviates the adjustment of both semiconductor diode chips, because position errors of the diode chips will invite no serious problem unlike conventional light sources.

A semiconductor laser diode (1) and a semiconductor photodiode (2) are fitted on a header (3) which is a metal disc with holes and a protrusion. The laser diode (1) has an active layer (10) which converts electric current to photons. The active layer (10) emits light beams both from a front end (7) and a bottom end (8) of the laser diode (1). The ratio of powers of the front beams to the rear beams is constant, irrespective of the power. The laser diode is fixed on a side near the top of the protrusion with both ends parallel with axial direction. The photodiode chip (2) is fixed on the central bottom of the header (3). A cap with an window is fitted to the upper surface of the header (3). A lens (6) is provided in the window of the cap (5). Leads (4) are piercing holes of the header (3) and fixed at the holes by insulating adhesive ( e.g. glass ). Wires connects the leads to electrodes of diode chips (1) and (2). The cap (5) and the lens (6) airtightly seal the semiconductor diode chips (1) and (2). The laser beams emitted to the front end is introduced to an optical fiber (9). The beams propagate in the optical fiber to a receiver which is installed at the other end of the optical fiber. The laser beams emitted to the rear end directly enter the monitoring photodiode chip (2). FIG. 2 demonstrates the behavior of the rear beams. The photodiode chip (2) has a semiconductor substrate (11), epitaxial layers (12) deposited on the substrate (11), a diffusion region (13) formed on a central part of the epitaxial layers (12), a pn-junction (18) as a boundary between the diffusion region (13) and the epitaxial layers (12), and annular electrode (14) formed on the diffusing region (13). The diffusion region (13) and the substrate (11) have reciprocal conduction properties. Namely, if the substrate is n-type, the diffusion region (13) is p-type. On the contrary, if the substrate is p-type, the diffusion region (13) is n-type. The diffusion region is produced by diffusing thermally pertinent dopants. The central portion enclosed by the annular electrode (14) is a light receiving region (21). The peripheral portion outside the pn-junction (18) is a light non-receiving region (22). The peripheral non-receiving region is covered by a dielectric layer (17) for reflecting or absorbing light beams. Some beams (20) emitted from the laser diode (1) reach the non-receiving region (22). But the beams are reflected or absorbed entirely by the dielectric layer (17). No beams enter the non-receiving region. No pairs of electrons and holes are exited in the non-receiving region. Thus, no extra photocurrents with slow response will be induced. The light source of this invention enjoys high speed transmission with the high speed control of laser diode on the basis of the monitoring photodiode. The dielectric layer (17) on the non-receiving region facilitates the determination of positions of the diode chips (1) and (2) on the header, because the leak beams (20) irradiating the non-receiving region (22) is annoyance no more. An easy assembly reduces the time and cost for assembling the device. The problem of delayed photocurrents has been completely solved by the peripheral dielectric layer.

The dielectric layer can be fabricated by CVD methods. The material of the dielectric layer is, e.g. SiN, a-Si, AlN, TiN, $SiO_2$, and so on. When the dielectric layer prevents light from entering the non-receiving region by reflecting the light, the dielectric layer shall be an alternating dielectric multilayer having repetition of a first medium sublayer and a second medium sublayer. The effective thickness, i.e. product of thickness by refractive index of each sublayer must be one fourth of the light wavelength. Each boundary between the different sublayers reflects light. If the effective thickness is one fourth of the wavelength of the light, all phases of reflected light beams coincide with each other. Thus, almost all beams are reflected by the assembly of boundaries. The principle of the reflection by a multilayer has been already well known. When the dielectric layer prevents light from entering the non-receiving region by absorbing light, the dielectric layer must have high absorption coefficient for the light.

An embodiment of a semiconductor light source for optoelectronic transmission of a long wavelength band between 1.1 μm and 1.6 μm will now be explained in detail. A photodiode chip (2) has an InP substrate of n-type and a non-doped epitaxial InGaAs layer (12) deposited on the InP substrate. A p-type region (13) of a 300 μm diameter is formed by diffusing zinc (Zn) metal which is a p-type dopant. An antireflection film (24) made from SiON is formed on a central receiving part (21) enclosed by an annular electrode (14). A periphery (22) outside the annular electrode (14) is covered with a dielectric layer (17) which reflects almost all beams (20). A photodiode chip (2) is slantingly mounted on the bottom of a covar header (3) upside up. A laser diode (1) with an active layer (10) which emits light beams of 1.1 μm to 1.6 μm in wavelength to both ends (7) and (8) is mounted on a protrusion of the covar header (3) with SnPb or AuSn solder. The active layer (10) of the laser diode chip (1) is parallel with an axial line of the device. Gold wires of a 20 μm diameter connect electrodes of the chips (1) and (2) to leads (4) for supplying driving currents to the laser diode (1) and for extracting the photocurrent from the photodiode (2). A cap (5) with a lens (6) is welded on the header (3) for sealing an inner space airtightly. The laser diode chip (1) emits light beams both to the front end (7) and the rear end (8). The front beams is converged by the lens (6) and enter a core of an optical fiber (9). The rear beams enter the monitoring photodiode (2). In order to prevent the light reflected at the receiving region (21) and the non-receiving region (22) from entering the laser diode and perturbing the laser oscillation, the photodiode chip (2) is mounted slantingly on the header (3). A normal on the photodiode chip surface inclines at 15 degrees to an extension of the active layer (10) of the laser diode (1).

To examine the response performance for sending digital signals, the semiconductor light source is serried as a transmitter of digital optoelectronic communication of a bit rate of 1 Gbps ( $10^9$ bit/sec ). No fluctuation of the light intensity of the laser diode is observed both in the interval of "1" and in the interval "0". Because of the fast response of the monitoring photodiode, a peak holding control can be employed for the control of the driving current of the laser diode. The control circuit lets the driving circuit supply no excess current at the early stage of a pulse nor insufficient current at the final stage thereof. Since neither excess driving current nor reverse voltage is applied to the laser diode, the laser diode enjoys long duration of life.

Another example of a photodiode is exhibited by FIG. 7 and FIG. 8. The photodiode has an n+-type InP substrate (11) with a carrier density of $2 \times 10^{18}$ cm$^{-3}$, an undoped InP buffer layer (12a) with a carrier density of $2 \times 10^5$ cm$^{-3}$, an undoped InGaAs receiving layer (12b) with a carrier density of $2 \times 10^{15}$ cm$^{-3}$ and an undoped InP window layer (12c) with a carrier density of $2 \times 10^{15}$ cm$^{-3}$. The InP buffer layer (12a), InGaAs receiving layer (12b) and InP window layer (12c) are epitaxially deposited on the InP substrate (11) in turn. The thicknesses of the epitaxial layers (12a), (12b) and (12c) are commonly 2 μm. A p-type region (13) is formed by diffusing zinc (Zn) at the center of the epitaxial layers (12c) and (12b). The p-type region (13) is 300 μm in diameter. An annular p-side electrode (14) is formed on the p-type region (13). A planar n-side electrode (15) is evaporated on the bottom surface of the InP substrate (11).

An antireflection layer (24) of SiON is formed on a receiving region (21) enclosed by the annular electrode (14). A protective layer (28) of SiN is deposited on a non-receiving region (22) outside the annular electrode (14). A dielectric multilayer (17) is deposited on the periphery, i.e. non-receiving region (22). The dielectric multilayer (17) consists of alternating repetition of a first sublayer (17a) and a second sublayer (17b). The effective thickness of each sublayer, i.e. product of thickness by refractive index, is one fourth of the wavelength of the light. In the example, the first sublayer (17a) is an amorphous silicon (a-Si) film. The thickness of the a-Si film is 120 nm. The refractive index is 3.2. Effective thickness is 384 nm. The second sublayer (17b) is a silicon nitride film (SIN). The thickness of the SiN film is 215 nm. The refractive index is 1.8. Effective thickness is 387 nm. These effective thicknesses are one fourth of the light wavelength 1.54 μm.

What we claim is:

1. A semiconductor light source comprising:
    a laser diode for emitting light beams from a front end and from a rear end,
    a photodiode for monitoring light beams emitted from the rear end of the laser diode,
    a header for supporting the laser diode and the photodiode, and
    leads fitted to the header for supplying driving currents to the laser diode and for extracting photocurrents from the photodiode,
    wherein the photodiode has a substrate with two surfaces, epitaxial layers grown on a surface of the substrate, a pn-junction produced at a center of the epitaxial layers, an electrode formed on the epitaxial layers above the pn-junction, another electrode deposited on the other surface of the substrate, a light receiving region defined by the pn-junction, and a peripheral non-receiving region outside the pn-junction,
    wherein the photodiode has a dielectric layer on the non-receiving region for reflecting or absorbing light beams irradiating thereon.

2. A semiconductor light source comprising:
    a laser diode for emitting light beams from a front end and from a rear end,
    a photodiode for monitoring the light beams emitted from the rear end of the laser diode,
    a header with an upper surface, a bottom surface and a protrusion on the upper surface for supporting the photodiode on the upper surface and the laser diode on a side of the protrusion,
    leads fitted to the header for supplying driving currents to the laser diode and for extracting photocurrents from the photodiode,
    a cap with a window fixed on the upper surface of the header, and
    a lens fitted in the window,
    wherein the lens, the laser diode chip and the photodiode chip are aligned along a normal of the upper surface of the header,
    wherein the photodiode has a substrate with an upper surface and a bottom surface, epitaxial layers grown on the substrate, a pn-junction produced at a center of the epitaxial layers, an electrode formed on the epitaxial layers above the pn-junction, another electrode formed on the bottom surface of the substrate, an light receiving region defined by the pn-junction, and a peripheral non-receiving region outside the pn-junction.
    wherein the photodiode has a dielectric layer on the non-receiving region for reflecting or absorbing light beams irradiating thereon.

3. A semiconductor light source as claimed in claim 2, wherein the photodiode chip inclines to the surface of the header in order to prohibit light beams reflected on the photodiode chip from returning the laser diode and perturbing oscillation of the laser.

4. A semiconductor light source as claimed in claim 3, wherein the inclination of a normal on the photodiode chip to an extension of the laser diode surface is between 5 degrees and 20 degrees.

5. A semiconductor light source as claimed in claim 2, wherein the dielectric layer formed on the non-receiving region is a dielectric multilayer having alternating repetition of two sublayers with different refractive indices and thicknesses and the products of the thicknesses by the refractive indices of the sublayers are one fourth of the wavelength of the light.

6. A semiconductor light source as claimed in claim 5, wherein the materials of the sublayers are two selected from the group consisting of SiN, SiOn, a-Si, TiN and AlN.

7. A semiconductor light source as claimed in claim 2, wherein the dielectric layer formed on the no-receiving region has high absorption coefficient for the light emitted by the laser.

8. A semiconductor as claimed in claim 5, wherein the lens is a spherical lens.

9. A semiconductor light source comprising:
    a laser diode for emitting light beams from a front end and from a rear end,
    a photodiode for monitoring the light beams emitted from the rear end of the laser diode,
    a header with an upper surface, a bottom surface and a protrusion on the upper surface for supporting the photodiode on the-upper surface and the laser diode on a side of the protrusion,
    leads fitted to the header for supplying driving currents to the laser diode and for extracting photocurrents from the photodiode,
    a cap with a window fixed on the upper surface of the header, and
    a lens fitted in the window,
    wherein the lens, the laser diode chip and the photodiode chip are aligned along a normal of the upper surface of the header,
    wherein the photodiode has an n+-type InP substrate with an upper surface and a bottom surface, an undoped InP buffer layer epitaxially grown on the InP substrate, an undoped InGaAs receiving layer epitaxially grown on the InP buffer layer, an undoped InP window layer epitaxially grown on the InGaAs receiving layer, a pn-junction produced by diffusing zinc at a center of the InP window layer and the InGaAs receiving layer, an electrode formed on the InP window layer above the pn-junction, another electrode formed on the bottom surface of the InP substrate, an light receiving region defined by the pn-junction, and a peripheral non-receiving region outside the pn-junction,
    wherein the photodiode has a dielectric layer on the non-receiving region for reflecting or absorbing light beams irradiating thereon.

10. A semiconductor light source as claimed in claim 9, wherein the dielectric layer formed on the non-receiving region is a dielectric multilayer having alternating repetition of two sublayers with different refractive indices and thicknesses and the products of the thicknesses by the refractive indices of the sublayers are one fourth of the wavelength of the light.

11. A semiconductor light source as claimed in claim 10, wherein the materials of the sublayers are two selected from the group consisting of SiN, SiOn, a-Si, TiN and AlN.

12. A semiconductor light source as claimed in claim 10, wherein the sublayers are SiN and a-Si, the SiN sublayer has a thickness of 215 nm and a refractive index of 1.8, the a-Si sublayer has a thickness of 120 nm and a refractive index of 3.2 for the light of a wavelength of 1540 nm.

13. A semiconductor light source as claimed in claim 10, wherein the receiving region of the photodiode is covered with an antireflection layer which is transparent to the light emitted by the laser.

14. A semiconductor light source as claimed in claim 13, wherein the antireflection layer is a SiON film deposited by a CVD method.

15. A semiconductor light source as claimed in claim 10, wherein the photodiode chip inclines to the surface of the header in order to prohibit the light beams reflected on the photodiode chip from returning the laser diode and perturbing oscillation of the laser.

16. A semiconductor light source as claimed in claim 15, wherein the inclination of a normal on the photodiode chip to an extension of the laser diode surface is between 5 degrees and 20 degrees.

17. A semiconductor light source as claimed in claim 15, wherein the inclination of a normal on the photodiode chip to an extension of the laser diode surface is in the neighborhood of 15 degrees.

18. A semiconductor light source as claimed in claim 10, wherein the dielectric layer formed on the non-receiving region has high absorption coefficient for the light emitted by the laser.

* * * * *